US006760167B2

(12) United States Patent
Meehan et al.

(10) Patent No.: US 6,760,167 B2
(45) Date of Patent: Jul. 6, 2004

(54) APPARATUS, SYSTEM, AND METHOD FOR PRECISION POSITIONING AND ALIGNMENT OF A LENS IN AN OPTICAL SYSTEM

(75) Inventors: Michael F. Meehan, Southbury, CT (US); David G. Taub, Stamford, CT (US); Daniel N. Galburt, Wilton, CT (US)

(73) Assignee: ASML Holding N.V. (NL)

( * ) Notice: Subject to any disclaimer, the term of this patent is extended or adjusted under 35 U.S.C. 154(b) by 0 days.

(21) Appl. No.: 10/403,027

(22) Filed: Apr. 1, 2003

(65) Prior Publication Data

US 2003/0202260 A1 Oct. 30, 2003

Related U.S. Application Data

(63) Continuation of application No. 09/841,108, filed on Apr. 25, 2001, now Pat. No. 6,556,364.
(60) Provisional application No. 60/199,393, filed on Apr. 25, 2000.

(51) Int. Cl.[7] .............................. G02B 7/02; H01S 3/08; G03B 27/42; A47G 1/24
(52) U.S. Cl. ....................... 359/822; 359/819; 372/107; 372/108; 355/53; 247/487
(58) Field of Search .................................. 359/822, 819, 359/811, 813, 814; 372/107, 108; 355/53, 55; 248/485, 487

(56) References Cited

U.S. PATENT DOCUMENTS

| | | | |
|---|---|---|---|
| 3,989,358 A | 11/1976 | Melmoth ..................... 359/813 |
| 4,442,524 A | 4/1984 | Reeder et al. .............. 372/107 |
| 4,534,621 A | 8/1985 | Miki et al. .................. 359/827 |
| 5,353,167 A | 10/1994 | Kuklo et al. ................ 359/876 |
| 5,376,988 A | 12/1994 | Osanai ........................ 355/53 |
| 5,986,827 A | 11/1999 | Hale .......................... 359/822 |
| 6,005,723 A | 12/1999 | Kosaka et al. .............. 359/822 |
| 6,220,561 B1 * | 4/2001 | Garcia ........................ 248/487 |
| 6,229,657 B1 * | 5/2001 | Holderer et al. ............ 359/822 |
| 6,259,571 B1 * | 7/2001 | Holderer et al. ............ 359/819 |
| 6,388,823 B1 * | 5/2002 | Gaber et al. ................ 359/819 |

FOREIGN PATENT DOCUMENTS

| | | |
|---|---|---|
| DE | 3814985 A1 | 12/1988 |
| DE | 19724246 A1 | 4/1998 |
| DE | 19827603 A1 | 12/1999 |
| DE | 19859634 A1 | 6/2000 |
| DE | 19908554 A1 | 8/2000 |

OTHER PUBLICATIONS

Patent Abstract of Japanese Publication No. 10186198, Japanese Patent Office, 1 page (Jul. 1998).
Copy of Invitation to Pay Additional Fees, including a Partial International Search Report, from PCT Appl. No. PCT/US01/13140, completed Feb. 11, 2002, 6 pages.

* cited by examiner

*Primary Examiner*—Loha Ben
(74) *Attorney, Agent, or Firm*—Sterne, Kessler, Goldstein & Fox P.L.L.C.

(57) ABSTRACT

An apparatus, system, and method for precision positioning and alignment of a lens in an optical system. The apparatus includes a support, a lever having a pivot point, and a first actuator and a second actuator coupled to the lever and to the support. The first actuator and the second actuator are used to position the lever and thereby position the lens. The first actuator is used to make finer position adjustments of the lever than are made by the second actuator. In one embodiment, the first actuator and the second actuator are pneumatic bellows. In another embodiment, the first actuator and the second actuator are electromechanical devices. A spring can be used to apply a biasing force to the lever.

19 Claims, 6 Drawing Sheets

APPARATUS, SYSTEM, AND METHOD FOR PRECISION POSITIONING AND ALIGNMENT OF A LENS IN AN OPTICAL SYSTEM

CROSS-REFERENCE TO RELATED APPLICATIONS

This application is a continuation of U.S. application Ser. No. 09/841,108, filed Apr. 25, 2001, now U.S. Pat. No. 6,556,364, which claims the benefit of U.S. Provisional Application Ser. No. 60/199,393, filed Apr. 25, 2000.

FIELD OF THE INVENTION

This invention relates generally to an optical system. More particularly, it relates to a photolithographic optical reduction system used in semiconductor manufacturing.

BACKGROUND OF THE INVENTION

Semiconductors are typically manufactured using various photolithographic techniques, which are implemented using complex optical systems. For example, one complex optical system used in the manufacturing of semiconductors is a photolithographic optical reduction system. While these complex optical systems perform adequately for their intended purposes, these systems have certain limitations that affect the minimum size of component features that can be accurately reproduced on a semiconductor chip. One such limitation is lens position and/or alignment.

As semiconductor manufacturers strive to produce smaller semiconductor features, minor positioning errors or misalignment of lenses in photolithographic optical reduction systems will have an effect on the minimum size of component features that can be accurately reproduced. In addition, minor changes in the optical or mechanical properties of the photolithographic optical reduction systems over time, for example, due to variations in environmental temperature or compaction of the lenses of a system, will also have an effect on the minimum size of component features that can be accurately reproduced. Optical imaging, lens position and alignment can be compromised by all sorts of changes that occur in the mechanical properties of materials over time, due for example to effects such as creep. Furthermore, lens position and/or alignment can also change due to forces and loads experienced during shipping and handling of these photolithographic systems. As would be known to a person skilled in the relevant art(s), each of these listed changes, and others, affect the size of semiconductor features that can be accurately reproduced.

In the past, the lenses in a photolithographic optical system have been positioned and aligned manually using, shims, adjustment screws, and other alignment techniques. In a typical system, lenses are held by lens rings, which are contained within a lens housing. The position of some or all of the lens rings within the lens housing can be determined, for example, by manually adjusting a series of adjustment screws. While this manual system and technique provides adequate alignment; this manual system and technique cannot correct or compensate for environmental factors and/or minor misalignments of lenses, and other changes of the lenses that occur during semiconductor production and over time. A better active alignment system and technique will allow for the production of smaller semiconductor features and correction of changes, including those listed herein, that limit the size of semiconductor features that can be accurately reproduced.

What is needed is an apparatus, system, and method for precision positioning and alignment of a lens in a complex optical system. The apparatus, system, and method should permit extremely small and precise adjustments to be made to the position of the lens while the optical system is in use.

SUMMARY OF THE INVENTION

The present invention provides an apparatus, system, and method for precision positioning and alignment of a lens in an optical system. In one embodiment, the apparatus includes a support, a lever having a pivot point, and a first actuator and a second actuator coupled to the lever and to the support. The first actuator and the second actuator are used to position the lever and thereby position the lens. The first actuator is used to make finer position adjustments of the lever than are made by the second actuator. A spring can be used to apply a biasing force to the lever.

In an embodiment of the present invention, a first support for coupling to the peripheral edge of the lens is mechanically connected to a second concentric support using a plurality of positioning devices. At least one positioning device is configured to move the first support in an axial direction relative to the second support. A second positioning device can be used to move the first support relative to the second support in a direction substantially perpendicular to the axial direction.

Each positioning device comprises a lever, an actuator, and a flexure. The lever has a pivot point and is mounted on the second support. The actuator is connected to the lever and used to operate the lever about its pivot point. The flexure has a first end connected to the lever between the actuator and the pivot point. A second end of the flexure is connected to the first support. In a preferred embodiment of the present invention, the flexure is connected to the lever using a screw and a replaceable spacer between the lever and the flexure.

In a preferred embodiment, the actuator is a pneumatic bellows, with or without an internal or external spring. A compressible gas supply module is fluidly connected to the bellows. A control module in communication with the compressible gas supply module is used to operate the bellows. An optional sensor module is used to monitor a parameter relating to lens position and/or alignment and to provide data to the control module for automated positioning of the first support relative to the second support.

In a preferred embodiment, two actuators are connected to the lever. Both actuators can be used to make fine adjustments to the position of the lever. Preferably, one actuator (vernier actuator) is used to make finer adjustments to the position of the lever than the second actuator (primary positioning actuator). The vernier actuator can be connected to the lever, for example, either on the same side or the opposite side of a pivot with respect to the primary positioning actuator. In an embodiment, one actuator (i.e., the vernier actuator) is used to make position adjustments of the lever on an order of one-twentieth of the position adjustments typically made by the other actuator (i.e., the primary positioning actuator). Multiple primary positioning actuators, used to control a single axis of motion, can be connected to a common control source (e.g., a pressure source) thus reducing tilt or rotation errors due to control system variations.

It is a feature of the invention that it can be used to position one or more lenses of an optical system to correct or compensate for a variety of changes, including changes that occur in a photolithography optical reduction system that limit the size of semiconductor features that can be accurately reproduced.

BRIEF DESCRIPTION OF THE FIGURES

The accompanying drawings, which are incorporated herein and form part of the specification, illustrate the present invention and, together with the description, further serve to explain the principles of the invention and to enable a person skilled in the relevant art(s) to make and use the invention.

The present invention is described with reference to the accompanying drawings. In the drawings, like reference numbers indicate identical or functionally similar elements. Additionally, the leftmost digit of a reference number identifies the drawing in which the reference number first appears.

DETAILED DESCRIPTION OF THE PREFERRED EMBODIMENTS

Overview of the Invention and Terminology

Figure 1:
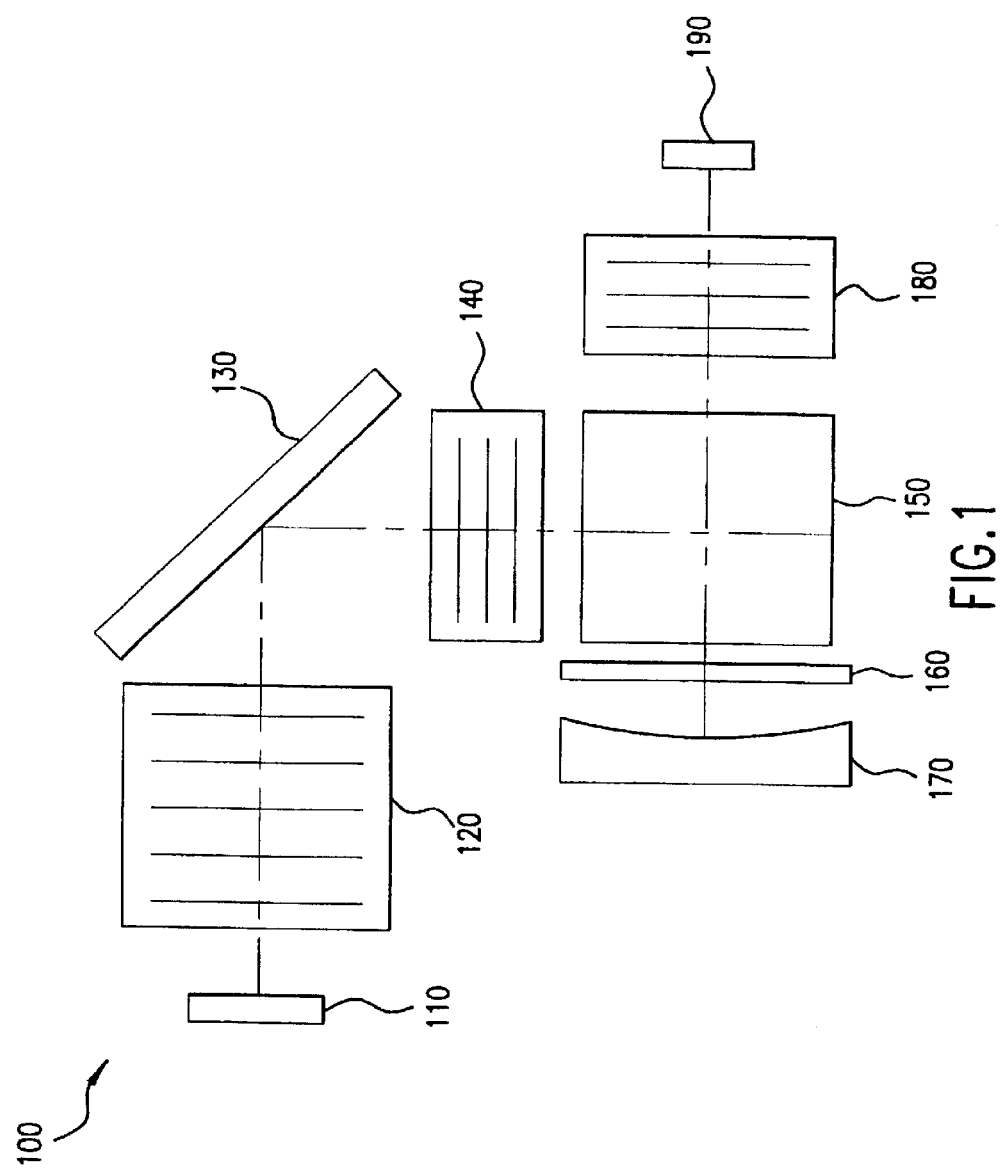
FIG. 1 is a diagram of a catadioptric optical reduction system in which the present invention may be used.

The present invention provides an apparatus, system and method for precision positioning and/or alignment of a lens in an optical system. In a preferred embodiment of the present invention, a first support for coupling to the peripheral edge of the lens is connected to a second mechanically concentric support using a plurality of positioning devices. At least one positioning device is configured to move the first support in an axial direction relative to the second support. A second positioning device is used to move the first support relative to the second support in a direction substantially perpendicular to the axial direction. Additional positioning devices can be used to provide for other types of motion such as, for example, rotation and tilt.

It is a feature of the invention that it can be used to position one or more lenses of an optical system to correct or compensate for a variety of changes, including changes that occur in a photolithography optical reduction system that limit the size of semiconductor features that can be accurately reproduced. Changes that can be corrected or compensated for using the invention include both mechanical changes such as, for example, lens positioning and alignment errors, and optical changes such as, for example, time varying changes due to environmental factors and changes in optical properties due to lens compaction. Other changes that can be corrected or compensated for using the invention will be known to persons skilled in the relevant art(s).

To better describe the present invention, the following terms are defined:

The term "actuator" means any apparatus that may be used to apply force to a mechanical device or to produce a mechanical displacement, such as a device that changes length. An actuator may be operated, for example, electro-mechanically or pneumaticly.

The term "catadioptric optical system" means an optical system whose focal power is achieved using both reflection and refraction. While the relative powers of the lenses and mirrors in a catadioptric optical system vary from system to system, such systems are typically characterized by the use of reflective surfaces to achieve a significant portion of the systems focal power, in combination with refractive surfaces of little or zero focal power. These systems produce an image that has improved aberrational characteristics.

The term "flexure" means a device, which is stiff in substantially only one dimension. Two ball joints connected by a rod is an example of a flexure. The flexures used in a preferred embodiment of the present invention comprise metal rods that have eight notches cut out of them and arranged as four opposed pairs. The opposed pairs of notches are cut out of one end of the metal rod so that the bottoms of the notches point to one another and are almost touching. Two additional notches are cut out of the bar, adjacent to the first pair, but oriented at a 90 degree angle (perpendicular) to the first pair. The opposite end of the metal rod has two pairs of notches cut in a similar manner.

The term "parameter relating to lens position and/or alignment" means any parameter that can be monitored and that is useful for controlling the position and/or alignment of a lens in an optical system.

Example Optical System in which the Present Invention May is Used

FIG. 1 shows an example optical system 100 in which the present invention may be used. Example optical system 100 is a catadioptric optical reduction system. Example optical system 100 is used in the manufacturing of semiconductors. As can be seen in FIG. 1, example optical system 100 contains a reticle 110, a first lens group 120, a folding mirror 130, a second lens group 140, a beamsplitter block 150, a quarter-waveplate 160, a concave mirror 170, and a third lens group 180. A semiconductor wafer is placed at an image plane 190.

Electromagnetic energy entering optical system 100 at reticle 110 converges to image plane 190. Optical system 100 can be used to reproduce the features of a semiconductor mask located at reticle 110 on a wafer located at image plane 190. Electromagnetic energy enters optical system 100 at reticle 110 and passes through lens group 120. Folding mirror 130 is used to direct electromagnetic energy exiting lens group 120 into lens group 140 and beamsplitter block 150. Beamsplitter block 150 directs electromagnetic energy through quarter-waveplate 160 to concave mirror 170. Concave mirror 170 reflects incoming electromagnetic energy back through quarter-waveplate 160 and beamsplitter block 150 into lens group 180. When the electromagnetic energy exits lens group 180, it converges to a focal point at image plane 190.

The present invention can be used to automatically and remotely control the position of any lens of optical system 100 fitted with the invention. By precisely controlling the position of lenses in optical system 100, the present invention can improve alignment and correct for misalignment during semiconductor production due, for example, to variations in environmental temperatures. Also, the active precision positioning of optical elements in the lens system improves imaging by correcting and/or compensating for other effects described herein.

The present invention is not limited to use in a catadioptric optical reduction system. It is a feature of the present invention that it may be used in many different types of optical systems to improve positioning and misalignment of a lens.

Apparatus for Precision Positioning and Alignment of a Lens

Figure 2:
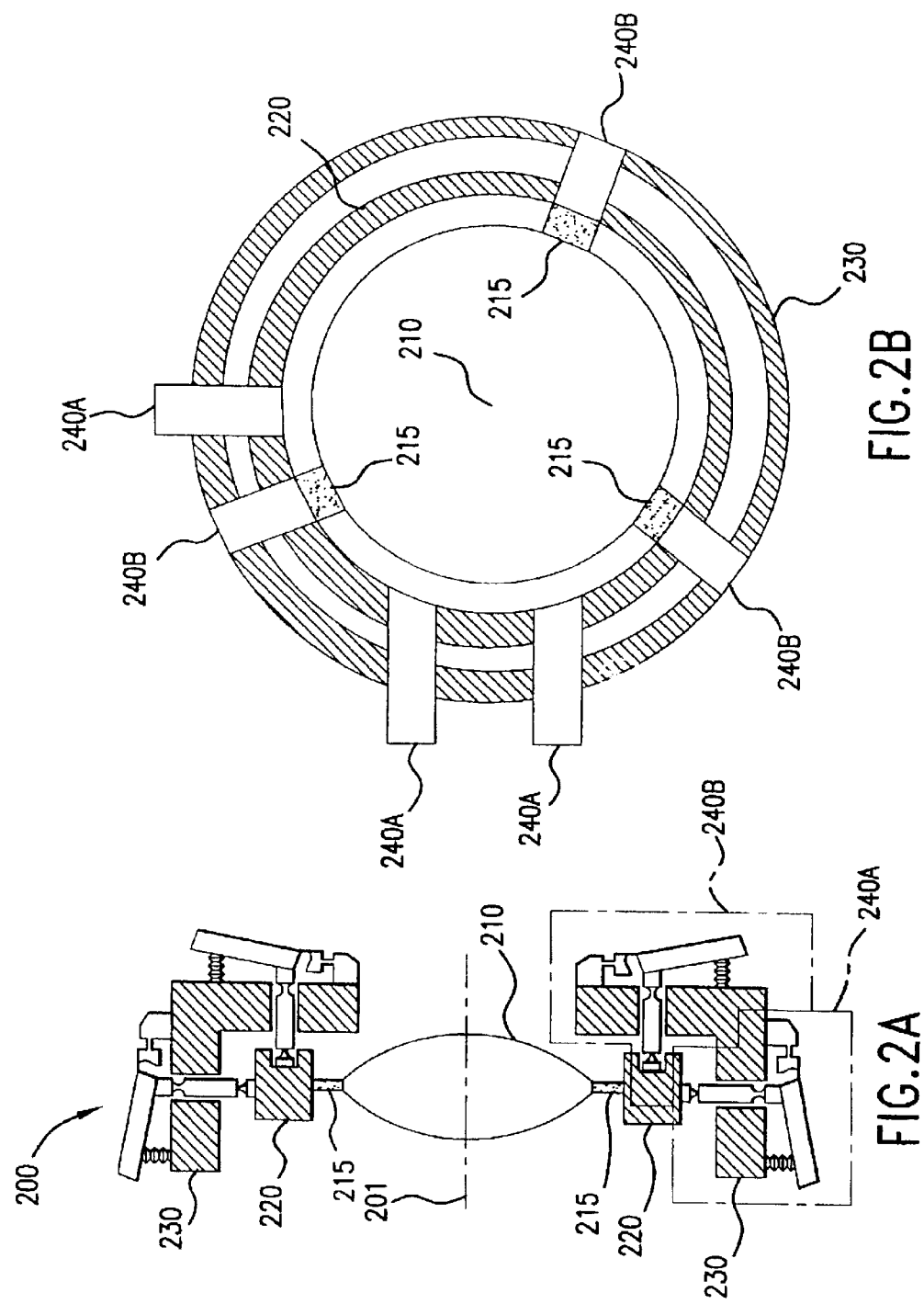
FIG. 2A is a side view of an apparatus according an embodiment of the present invention.
FIG. 2B is a top view of an apparatus according to an embodiment of the present invention.

FIG. 2A (side view) and FIG. 2B (top view) show an apparatus 200 according to a preferred embodiment of the present invention for supporting a lens 210. The apparatus comprises a first support 220 and a second support 230. First support 220 is connected to second support 230 by a plurality of positioning devices 240. Using positioning devices 240, it is possible to precisely position lens 210 and correct and/or compensate for changes in optical system 100, for example, for changes due to environmental factors or for other changes in optical system 100 as described herein or as would be known to a person skilled in the relevant art(s). For purposes of describing the invention, the position of positioning devices 240A relative to positioning devices 240B as shown in FIG. 2B have been rotated in FIG. 2A to more clearly depict their features and how they connect support 220 to support 230.

Lens 210 is attached to first support 220 by an attachment device 215. First support 220 and second support 230 are ring shaped. In a preferred embodiment, first support 220 and second support 230 are made of invar steel. Lens 210 is disposed within first support 220 and is concentric with first support 220. Attachment devices 215 are spaced approximately uniformly around the periphery of lens 210. In a preferred embodiment, each attachment device 215 includes epoxy adhesive. In this embodiment, epoxy adhesive is used at various locations around the periphery of lens 210 to attach lens 210 to first support 220. In another embodiment, metal clips and screws (not shown) are used to attach lens 210 to first support 220. In this embodiment, the metal clips fit securely over the peripheral edge of lens 210. The metal clips are attached to first support 220 using screws. Other means for attaching lens 210 to first support 220 are contemplated and would be apparent to a person skilled in the relevant art(s).

In a preferred embodiment of the present invention, a total of six positioning devices 240 are used to connect first support 220 to second support 230. Three positioning devices 240A and three positioning devices 240B are used to connect first support 220 to second support 230 as shown in FIGS. 2A and 2B. Positioning devices 240A are configured to move first support 220 relative to second support 230 in a direction substantially perpendicular to the axial direction of lens 210 (as depicted by axis 201 in FIG. 2A). Positioning devices 240B are configured to move first support 220 in substantially an axial direction (i.e., along axis 201) relative to second support 230. As would be apparent to a person skilled in the relevant art(s) given the discussion herein, more or less than six positioning devices 240 may be used to connect first support 220 to second support 230 and to position first support 220 relative to second support 230. It would also be apparent that additional motions of first support 220 can be achieved. For example, additional positioning devices can be added for rotation and tilt.

Figure 3:
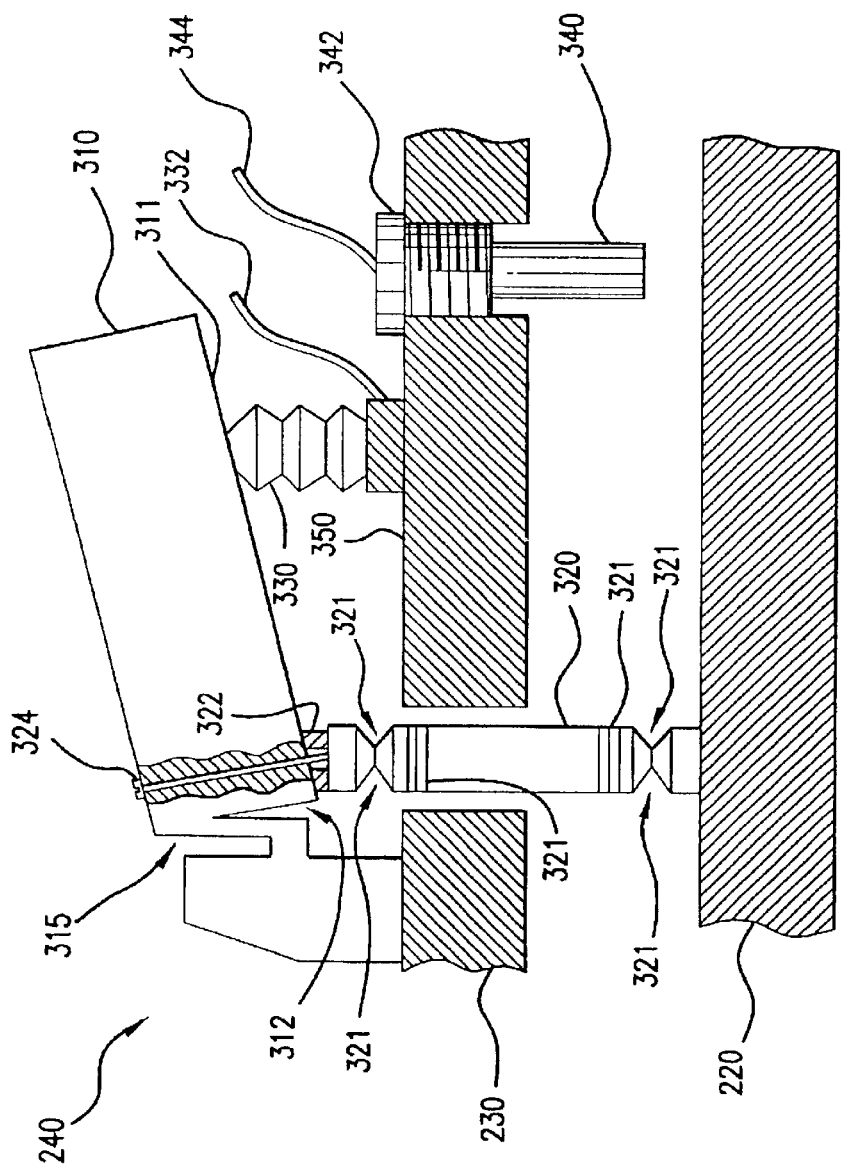
FIG. 3 is a diagram of a positioning device according to an embodiment of the present invention.

FIG. 3 shows a diagram of a positioning device 240 according to a preferred embodiment of the present invention. As can be seen in FIG. 3, positioning device 240 comprise a lever 310, a flexure 320, and an actuator 330. Actuator 330 is used to apply a force or displacement to one end of lever 310, which causes lever 310 to pivot about a pivot point 315.

In a preferred embodiment of the present invention, actuator 330 is a pneumatic bellows. Compressible gas (e.g., nitrogen) to operate the pneumatic bellows is supplied to the bellows via a gas line 332. As the compressible gas pressure in the bellows is increased, a force is applied by the bellows to lever 310. This force causes lever 310 to rotate about pivot point 315, thereby causing an edge 311 of lever 310 to move away from a surface 350 of second support 230. As the compressible gas pressure in the bellows is decreased, the force applied to lever 310 is decreased. Moreover, the stiffness or resiliency of the bellows causes the bellows to contract to its unextended position when compressible gas pressure in the bellows is decreased. This causes the edge 311 of lever 310 to move toward surface 350 of second support 230.

In a preferred embodiment, a spring (not shown), such as a leaf spring or coil spring, can be attached between lever 310 and second support 230 to apply a biasing force to lever 310 that will pull edge 311 of lever 310 toward the surface 350 of second support 230 whenever the compressible gas pressure in the bellows is decreased. A spring (not shown) can also be located within the bellow to apply a biasing force to lever 310 that will pull edge 311 of lever 310 toward the surface 350 of second support 230 whenever the compressible gas pressure in the bellows is decreased. How to attach a spring to apply a biasing force would be apparent to a person skilled in the relevant art(s), given the discussion herein.

Another embodiment uses a second bellows, with or without a spring, opposed to the first bellows 330. As would be apparent to one skilled in the relevant art, independently varying the pressure to each of the bellows produces a range of positions of lever 310.

In another embodiment of the present invention, actuator 330 is an electromechanical device (not shown), such as a solenoid or a linear motor. In this embodiment, an electrical current is passed through a coil to move an iron bar disposed substantially within the coil. As a dc current is passed through the coil in a predetermined direction, the iron bar applies a force to lever 310 in a manner similar to that described above for the bellows. The force applied to the bellows is proportional to the current in the coil. A spring can be used to apply a biasing force that opposes the force applied by the iron bar. Other types of actuators such as piezoelectric, hydraulic, or screw-driven actuators are contemplated and would be apparent to a person skilled in the relevant art(s) given the discussion above.

As shown in FIG. 3, lever 310 is connected to an end of flexure 320 using a replaceable spacer 322 and a screw 324. The purpose of spacer 322 is to make adjustments in the calibration of device 240 and thereby ensure that the full positioning range of positioning device 240 is available to position first support 220 relative to second support 230. For example, it is possible that in order to initially align lens 210, actuator 330 must be fully extended so that a maximum force is applied to level 310. When this happens, actuator 330 will not be able to apply an additional force to lever 310, and positioning device 240 will not be able to correct or compensate for any misalignments that require actuator 330 to apply an additional force to lever 310. The situation can be corrected, however, by replacing spacer 322 with a second spacer 322 that has a shorter axial length. Using a spacer 322 that has a shorter axial length will draw flexure 320 closer to edge 311 of lever 310 and allow the force applied by the bellows to lever 310 to be reduced. As would be apparent to a person skilled in the relevant art(s), given the discussion herein, a spacer 322 should be chosen, which has an axial length that permits actuator 330 to operate about the middle of its minimum and maximum extension lengths.

As can be seen in FIG. 3, a second end of flexure 320 is attached to first support 220. As actuator 330 is used to rotate lever 310 about pivot point 315, the position of flexure 320 is changed. As the force applied by actuator 330 is increased, flexure 320 pulls first support 220 closer to second support 230. As the force applied by actuator 330 is decreased, flexure 320 pushes first support 220 away from second support 230. In this manner, positioning devices 240 can be used to position first support 220 and lens 210 relative to second support 230.

Flexure 320 is stiff in substantially only one dimension. In a preferred embodiment of the present invention, flexure 320 is made from a metal rod that has eight notches 321 cut out of it arranged as four opposed pairs. The opposed pairs of notches 321 are cut out of one end of the metal rod so that the bottoms of the notches point to one another and are almost touching. Two additional pairs of notches 321 are cut out of the opposite end of the metal rod in a similar manner. In a preferred embodiment, the flexures are made of invar steel.

In a preferred embodiment, lever 310 of positioning device 240 has a living hinge formed by cutting notches 312 and 315 into lever 310, as depicted in FIG. 3. In this embodiment, the adjustment range of first support 220 relative to second support 230 is in the range of approximately ±200 microns. The adjustment resolution of this embodiment is related to the materials and the actuator employed and can be substantially better than 0.1 micron.

Figure 4:
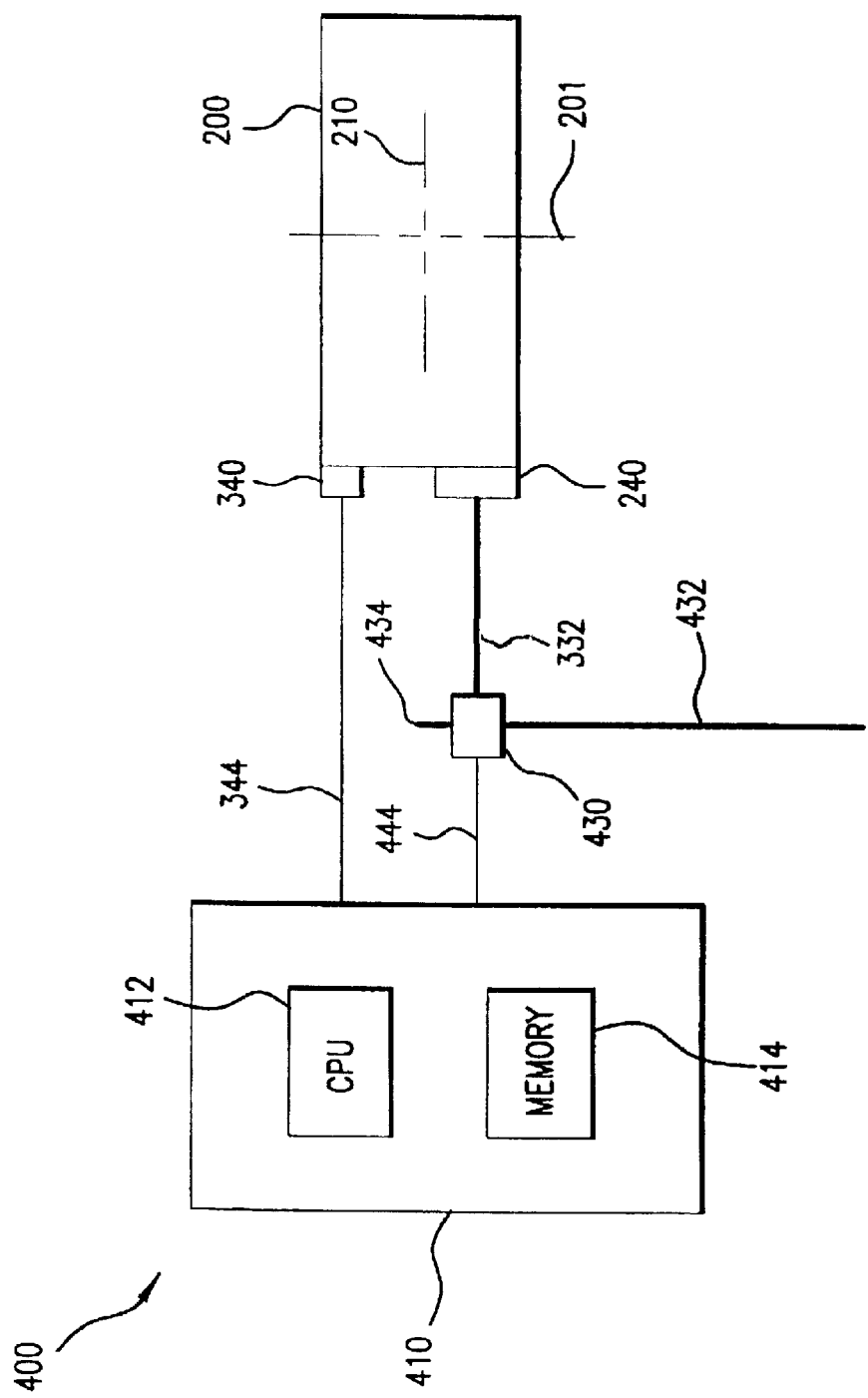
FIG. 4 is a diagram of a system for precision positioning and/or alignment of a lens in an optical system according to an embodiment the present invention.

An optional sensor module 340 is shown in FIG. 3 that can be used to provide data relating to the position of lens 210 to a control module 410 (as shown in FIG. 4). In an embodiment, sensor module 340 is attached to second support 230. In an embodiment, proximity sensor module 340 measures the position of first support 220 relative to second support 230. In this embodiment, sensor module 340 can comprise, for example, a capacitive sensor. In another embodiment, sensor module 340 comprises a sensor, such as a thermocouple, that can used to measures temperature. Other types of sensors modules 340 are contemplated, which can be used to monitor parameters relating to lens position and/or alignment. For example, sensor module 340 can be located near beamsplitter block 150 and used to measure a predetermined portion of the electromagnetic energy spectrum. Sensor modules of the type that can be used to monitor the characteristics of electromagnetic energy exiting optical system 100 would be known to a person skilled in the relevant art(s). The characteristics of the electromagnetic energy exiting optical system 100 can be related to the alignment of the lenses of optical system 100, and can be used to adjust the position of a lens and thereby correct or compensate for lens misalignment.

Figure 6:
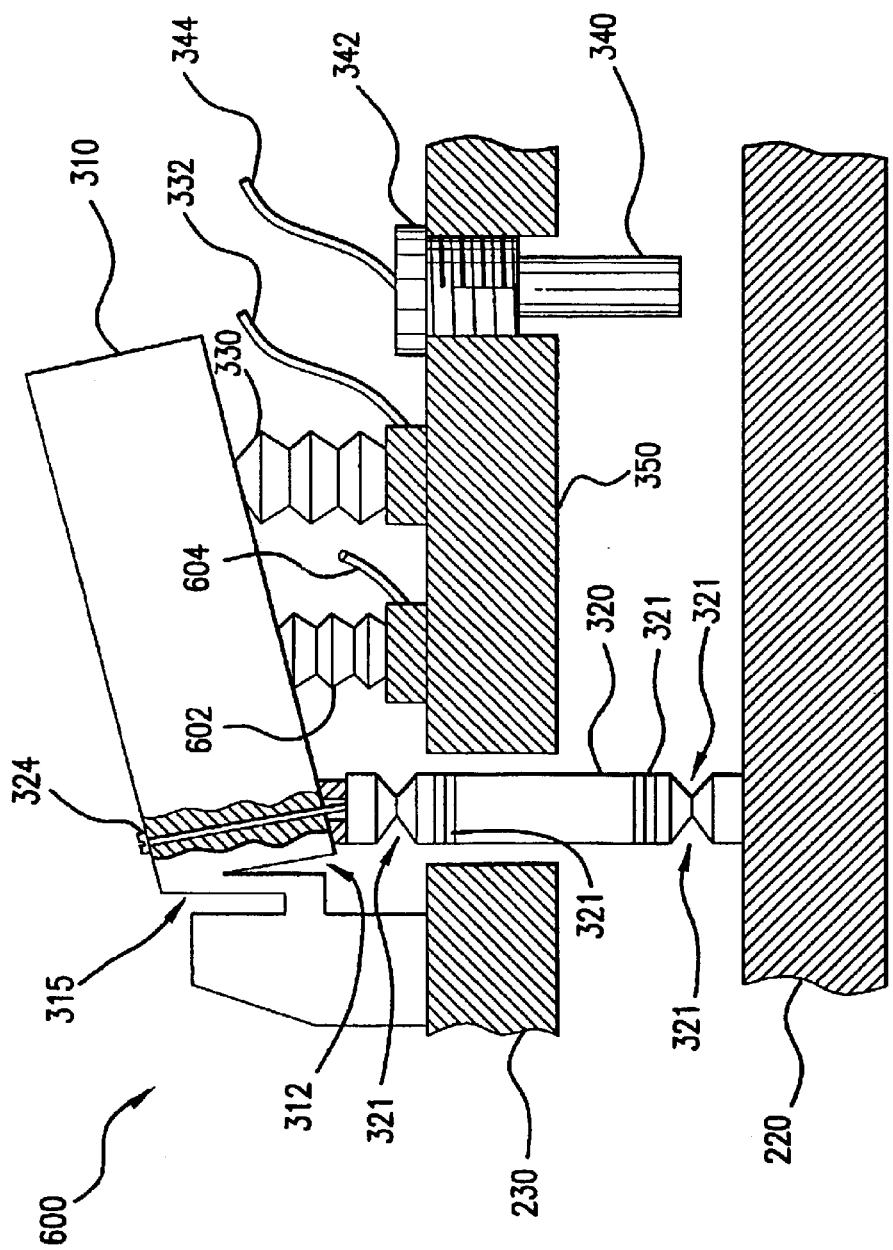
FIG. 6 illustrates a second embodiment of a positioning device according to the present invention.

FIG. 6 illustrates another embodiment of a positioning device 600 according to the invention, which can be used to precisely position lens 210 and correct and/or compensate for changes in optical system 100. Positioning device 600 comprises second support 230, lever 310, a primary positioning actuator 330, and a vernier actuator 602. Vernier actuator 602 can be on either side of a pivot (formed, e.g., by notches 312 and 315).

As illustrated in FIG. 6, actuators 330 and 602 are each coupled to both second support 230 and lever 310. Operation of actuator 330 and/or actuator 602 controls the position of lever 310, in a manner that would be apparent to a person skilled in the relevant art given the description of the invention herein. In an embodiment, second support 230 is coupled to lever 310 by two actuators, a primary positioning actuator 330 and a vernier actuator 602. As described herein, flexure 320 passes through an opening in second support 230 and is coupled to level 310.

As illustrated in FIG. 6, in an embodiment, primary positioning actuator 330 and vernier actuator 602 are pneumatic bellows. A compressible gas system (e.g., a nitrogen gas system) is coupled to actuators 330 and 602 using gas lines 332 and 604, respectively.

Other features of positioning device 600 are illustrated in FIG. 6, which will be apparent to one skilled in the relevant art. For example, the size of actuators (bellows) 330 and 602 and/or position (mechanical leverage) of actuators (bellows) 330 and 602 can be varied to adjust the force applied to lever 310 and thus the positioning characteristic of device 600. Actuator 602 can be placed, for example, closer to the pivot point of lever 310 in order to reduce the force applied by actuator 602 to lever 310.

It is a feature of positioning device 600 that multiple of these devices (primary actuators), driven by a common control system (e.g., pressure system), can be used to reduce the tilt of an axis of motion of lens 210 as a result of variations in control (e.g., control pressure). The vernier actuator allows for the correction of undesired motions due to variations in primary actuator sensitivity or other causes. As would be known to a person skilled in the relevant art, control systems have accuracy limits that may be of importance for certain application. For example, when controlling the position of lens 210, accuracy limits of a control system may cause lens 210 to tilt. Using device 600 eliminates or reduces the tilt of lens 210. Tilt is controlled using vernier device 602.

In an embodiment of the invention, one or more devices 240, as shown in FIGS. 2A, 2B, and 3, are replaced with positioning device 600. For example, in an embodiment of the invention having just two positioning devices to control an axis of motion, either one or two devices 600 may be used to reduce tilt. In an embodiment of the invention having three positioning devices to control an axis of motion, either two or three devices 600 may be used to reduce tilt. Other embodiments of the invention use other numbers of devices 600 to reduce undesired motions due to primary actuator sensitivity or other causes.

System and Method for Precision Positioning and Alignment of a Lens

FIG. 4 illustrates one embodiment of a system 400 for precision positioning and/or alignment of a lens in optical system 100 according to the present invention. As can be seen in FIG. 4, system 400 comprises apparatus 200, a sensor module 340, a control module 410, a compressible gas supply module (not shown), and a precision adjustable valve 430. In order to simplify FIG. 4 and more clearly show the invention, apparatus 200 is depicted as having a single positioning device 240. The position of lens 210 is controlled by apparatus 200 as described above. System 400 permits minor adjustments to be made to the position of lens 210 while optical system 100 is in use.

Figure 5:
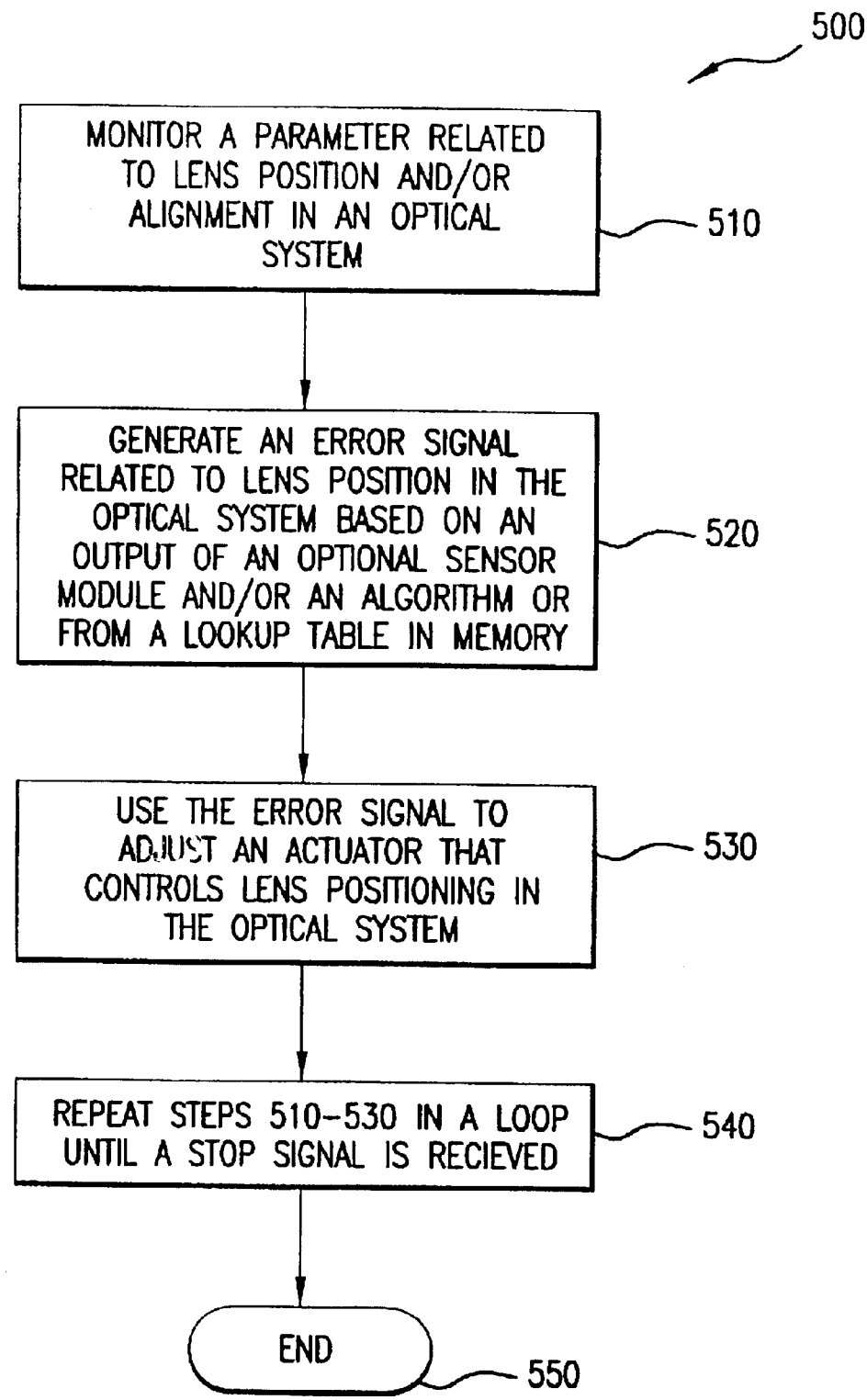
FIG. 5 is a flowchart of a method for precision positioning and/or alignment of a lens in an optical system according to an embodiment the present invention.

In an embodiment of the present invention, system 400 controls the position of lens 210 using a method 500. As will be understood by a person skilled in the relevant art(s), given the description of the invention herein, method 500 can be implemented using either an open-loop or a closed-loop control system. Method 500 is described with reference to FIGS. 4 and 5. Method 500 starts with system 400 in a state of equilibrium.

In step 510 of method 500, optional sensor module 340 is used to monitor a parameter related to lens alignment or position in optical system 100. The output of sensor module 340 is a voltage, current, or optical signal that is communicated to control module 410 by a communications link 344. Sensor module 340 can monitor any parameter that is measurable and that can be used to control position of a lens in optical system 100. For example, sensor module 340 can monitor temperature at various locations in optical system 100. Temperature can be used to determine thermally induced changes in optical system 100. Sensor module 340 can also monitor electromagnetic energy exiting optical system 100, for example electromagnetic energy exiting at beamsplitter block 150. Electromagnetic energy exiting optical system 100 can be used to determine the condition of the lenses in optical system 100. Other parameters that can be monitored by sensor module 340 will be apparent to a person skilled in the relevant art(s) given the discussion herein.

In step 520 of method 500, control module 410 uses the voltage, current, or optical signals received form sensor module 340 to generate an error signal related to lens position and/or alignment in optical system 100. In an embodiment of the present invention, the output of sensor module 340 is compared to a predetermined value stored in control module 410 to produce the error signal. One technique for storing the data in control module 410 is to store the data in a lookup table.

As shown in FIG. 4, control module 410 comprises a central processing unit (CPU) 412 and a memory unit 414. In an embodiment, several parameters can be monitored simultaneously by sensor module 340, or a plurality of sensor modules 340 can be used to monitor several parameters. Data relating the outputs of sensor module 340 to lens position, alignment and/or imaging in optical system 100 are stored in memory unit 414. For example, if sensor module 340 monitors temperature and lens position data, the various temperatures and lens positions that can be measured by sensor module 340 can be stored in memory unit 414 in the form of a lookup table that relates temperatures and/or lens position of optical system 100 to a pressure in the pneumatic bellows of the positioning devices, for example positioning device 240 shown in FIG. 4. In this embodiment, CPU 412 receives temperature and/or lens position data from sensor module 340, and CPU 412 then looks up the pressure for the bellows of positioning device 240 that corresponds to the data received form sensor module 340 in the lookup table stored in memory unit 414. CPU 412 generates an error signal based on the difference between the pressure data retrieved from the lookup table and the actual pressure in the bellows of positioning device 240. How to collect data relating the output of sensor module 340 to lens position and/or alignment in optical system 100 and form a lookup table relating such data would be apparent to a person skilled in the relevant art(s) given the discussion herein.

In another embodiment, control module 410 produces an error signal based solely on the combined outputs of sensor module 340 without retrieving data from a lookup table stored in memory. A person skilled in the relevant art(s) will know that other methods and techniques of generating an error signal based on the output of sensor module 340 are contemplated and considered to be part of the present invention.

In step 530 of method 500, the error signal generated in step 520 is used to adjust the compressible gas pressure in the bellows of positioning device 240 and thereby change the position of lens 210 to correct or compensate for lens misalignment in optical system 100. As shown in FIG. 4, compressed gas (e.g., nitrogen) is delivered via pneumatic connection 432. When the compressible gas pressure in the bellows of positioning device 240 needs to be increased based on the error signal, control module 410 sends a signal over a communications link 444 to three-way valve 430. This signal changes the position of valve 430 and allows compressed gas from pneumatic connection 432 to flow into the bellows of positioning device 240 until the error signal indicates that the desired gas pressure has been established in the bellows. When compressed gas pressure in the bellows needs to be decreased based on the error signal, control module 410 sends a signal to three-way valve 430 that vents compressed gas in the bellows through gas line 434 to the environment. Compressed gas in the bellows is vented to the environment until the error signal indicates that the desired compressed gas pressure has been established in the bellows.

In step 540 of method 500, steps 510 through 530 are continuously repeated in a loop until a stop signal is received. When a stop signal is received, control passes to step 550 and the method for precision positioning of a lens in an optical system ends.

Various embodiments of the present invention have been described above, which can be used to precisely position a lens in an optical system. It should be understood that these embodiments have been presented by way of example only, and not limitation. It will be understood by those skilled in the relevant art(s) that various changes in form and details of the embodiments described above may be made without departing from the spirit and scope of the present invention as defined in the claims. Thus, the breadth and scope of the present invention should not be limited by any of the above-described exemplary embodiments, but should be defined only in accordance with the following claims and their equivalents.

What is claimed is:

1. An apparatus for precision positioning of a lens in an optical system, comprising:

a support;

a lever having a pivot point coupled to said support; and a first actuator and a second actuator coupled to said lever, wherein said first and said second actuators are used to position said lever about said pivot point and position a lens, said first actuator being used to make finer position adjustments of said lever than are made by said second actuator.

2. The apparatus of claim 1, wherein said first actuator and said second actuator are pneumatic bellows.

3. The apparatus of claim 1, wherein said first actuator and said second actuator are electromechanical devices.

4. The apparatus of claim 3, wherein said first actuator and said second actuator are solenoids.

5. The apparatus of claim 3, wherein said first actuator and said second actuator are linear motors.

6. The apparatus of claim 1, further comprising:

a spring coupled to said lever, wherein said spring applies a biasing force to said lever.

7. A system for precision positioning of a lens in an optical system, comprising:

a support; and a plurality of positioning devices coupled to said support, each of said plurality of positioning devices including a lever having a pivot point coupled to said support, and a first actuator and a second actuator coupled to said lever, wherein said first and said second actuators are used to position said lever about said pivot point and position a lens, said first actuator being used to make finer position adjustments of said lever than are made by said second actuator.

8. The apparatus of claim 7, wherein said first actuator and said second actuator of each of said plurality of positioning devices are pneumatic bellows.

9. The system of claim 8, further comprising:
a compressible gas supply module fluidly connected to each of said pneumatic bellows; and
a control module, in communication with said compressible gas supply module, for controlling said compressible gas supply module to operate said pneumatic bellows.

10. The system of claim 9, further comprising:
a sensor module, in communication with said control module, for monitoring a parameter relating to lens position and for providing data to said control module for operating at least one of said pneumatic bellows.

11. The apparatus of claim 7, wherein said first actuator and said second actuator of each of said plurality of positioning devices are electromechanical devices.

12. The apparatus of claim 11, wherein said first actuator and said second actuator of each of said plurality of positioning devices are solenoids.

13. The apparatus of claim 11, wherein said first actuator and said second actuator of each of said plurality of positioning devices are linear motors.

14. The apparatus of claim 7, wherein each of said plurality of positioning devices further includes a bias spring coupled to said lever that applies a biasing force to said lever.

15. A method for precision positioning of a lens in an optical system, comprising the steps of:

(a) monitoring a parameter related to lens position in the optical system using a sensor module;

(b) generating an error signal related to lens position in the optical system based on the output of said sensor module; and (c) adjusting at least one primary actuator and at least one vernier actuator based upon the error signal, thereby changing the position of the lens, the vernier actuator being used to make finer position adjustments to the lens than are made by the primary actuator.

16. The method of claim 15, wherein the at least one primary actuator and the at least one vernier actuator are pneumatic bellows.

17. The method of claim 15, wherein the at least one primary actuator and the at least one vernier actuator are electromechanical devices.

18. The method of claim 15, wherein step (a) comprises:
monitoring a temperature affecting lens position.

19. The method of claim 15, wherein step (a) comprises:
monitoring a pressure affecting lens position.

* * * * *